(12) United States Patent
Dastidar et al.

(10) Patent No.: US 7,333,924 B1
(45) Date of Patent: Feb. 19, 2008

(54) METHOD AND SYSTEM FOR DEVICE LEVEL SIMULATION OF LARGE SEMICONDUCTOR MEMORIES AND OTHER CIRCUITS

(75) Inventors: Tathagato Rai Dastidar, Bangalore (IN); Partha Ray, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 555 days.

(21) Appl. No.: 10/880,181

(22) Filed: Jun. 28, 2004

(51) Int. Cl.
*G06F 17/00* (2006.01)
(52) U.S. Cl. .............................. 703/2; 703/13; 703/14; 708/139; 708/804; 708/834
(58) Field of Classification Search .................. 703/14, 703/2, 13; 708/139, 804, 834, 800
See application file for complete search history.

(56) References Cited

U.S. PATENT DOCUMENTS

| 7,031,889 | B1* | 4/2006 | McBride ........................ 703/2 |
| 7,181,383 | B1* | 2/2007 | McGauhy et al. ............. 703/14 |
| 2003/0109995 | A1* | 6/2003 | Mabuchi et al. .............. 702/64 |
| 2003/0173644 | A1* | 9/2003 | Nakase et al. ................ 257/532 |
| 2004/0015800 | A1* | 1/2004 | Zhong et al. ................... 716/5 |
| 2004/0196082 | A1* | 10/2004 | Pacha et al. .................. 327/215 |
| 2005/0050495 | A1* | 3/2005 | McGuffin et al. .............. 716/5 |
| 2005/0177816 | A1* | 8/2005 | Kudukoli et al. ........... 717/105 |

OTHER PUBLICATIONS

C. B. McDonald, and R. E. Bryant, "CMOS Circuit Verification With symbolic Switch-Level Timing Simulation" 2001 IEEE, vol. 21, No. 3, Mar. 2001, pp. 458-474.*

C. B. McDonald, and R. E. Bryant, "CMOS Circuit Verification With symbolic Switch-Level Timing Simulation" 2001 IEEE, vol. 21, No. 3, Mar. 2001.*

Dan Adler, "Switch-Level Simulation Using Dynamic Graph Algorthims"1991 IEEE.*

B. McDonald, and R. E. Bryant, "CMOS Circuit Verification With symbolic Switch-Level Timing Simulation" 2001 IEEE, vol. 21, No. 3, Mar. 2001.*

\* cited by examiner

*Primary Examiner*—Hugh Jones
*Assistant Examiner*—Kibrom K. Gebresilassie
(74) *Attorney, Agent, or Firm*—Girard & Equitz LLP

(57) ABSTRACT

A method for device level simulation of a circuit modeled by a set of CCR graphs, a computer system programmed to perform such a method, and a computer readable medium which stores code for implementing such a method. Typically, the circuit includes MOS transistors having unknown gate potentials, each CCR graph includes a top rail, and a bottom rail, and variable nodes, each of the transistors having unknown gate potential is modeled in the CCR graphs as a selectable resistor having a selected one of a first resistance and a much larger second resistance, and the method includes the steps of determining potentials at variable nodes of one of the CCR graphs with each selectable resistor of the graph having its first resistance (and also with each selectable resistor of the graph having its second resistance) without determining effective resistances between the variable nodes of the graph and the top rail or bottom rail.

9 Claims, 1 Drawing Sheet

METHOD AND SYSTEM FOR DEVICE LEVEL SIMULATION OF LARGE SEMICONDUCTOR MEMORIES AND OTHER CIRCUITS

BACKGROUND OF THE INVENTION

1. Field of the Invention

The present invention pertains to methods and systems (e.g., programmed computer systems) for device level simulation of semiconductor memory circuits and other circuits comprising MOS transistors.

2. Description of the Related Art

The term "netlist" will be used herein to denote a description of the connectivity of a circuit comprising elements. A netlist consists of predefined elements (e.g., resistors, capacitors, and switches) connected together by "nets." Each net is a conductor, and will sometimes be referred to herein as a node. The term "graph" will sometimes be used herein to denote a netlist.

Simulation and verification of large semiconductor memory netlists (and other large netlists) whose elements model MOS transistors, voltage sources, resistors, and capacitors has long been a very challenging task. Conventional simulators (e.g., conventional SPICE based simulators) cannot be used effectively to simulate or verify large semiconductor memory circuits since the circuits are usually too large for such simulators to handle. Even conventional simulators which can handle large netlists typically require too much time to simulate and verify a design for a large semiconductor memory circuit, by reading and writing every memory address, and thus are typically impractical to use for this purpose. Also, typical conventional simulators (e.g., SPICE based simulators) cannot detect unknown ("X") states or high impedance states at nets in electrical circuits of any type. Furthermore, the high degree of accuracy offered by commonly used conventional simulators is typically unnecessary for verification of large semiconductor memory circuits since only functional verification, and not accurate timing and power calculation, is typically required for large semiconductor memory circuit verification.

Typically also, event driven digital simulators (e.g., those based on Verilog) which deal with binary (0 or 1) or ternary (0 or 1 or X, where "X" denotes unknown or undeterminable) values cannot practically be used for simulation and verification of large semiconductor memory netlists (whose elements model MOS transistors, voltage sources, resistors, and capacitors) because the memories modeled by such netlists have custom designs (not standard-cell based designs) so that RTL or gate level Verilog descriptions of the memories do not exist. Even if a switch level Verilog netlist were used, the time required to simulate large semiconductor memory netlists with conventional Verilog simulators is too long, and often results in a crash. Also, switch level Verilog simulation requires accurate strength estimation for correct simulation, which is a difficult task that must be performed manually.

Thus, a fast digital simulator operating on transistor level netlists is the best choice for simulation and verification of large semiconductor memory netlists (and other large netlists) whose elements model MOS transistors, voltage sources, resistors, and capacitors. One such simulator is the conventional IRSIM program. The IRSIM program can detect unknown (X) states and high impedance states at nets, and typically works well to simulate and verify netlists for circuits having standard cell based designs. However, the IRSIM program typically fails when a user attempts to employ it to simulate and verify large semiconductor memory netlists, primarily due to inherent inaccuracies in its delay calculation algorithm.

The expression "MOS transistor circuit" is used herein to denote a circuit including MOS transistors (PMOS and/or NMOS transistors). Gates of at least some of the MOS transistors can be at unknown potentials.

The expression "CCR" (channel connected region) is used herein to denote a circuit that models a MOS transistor circuit and includes no element that is neither a resistor nor a capacitor nor a switch, and whose nodes correspond to nodes of the MOS transistor circuit that are reachable only through transistor source-drain (channel) connections. A CCR is often employed to model a MOS transistor circuit due to the nearly zero gate current of a MOS transistor. The expression "CCR graph" is used herein to denote a netlist that models or represents a CCR, includes no element that is neither a resistor nor a capacitor nor a switch, whose nets (nodes) can have fixed or variable potential, and whose nodes include a fixed node (a "bottom rail") at a reference potential and another fixed node (a "top rail") at a fixed potential greater than the reference potential. In FIG. 1, the circuit on the left includes PMOS transistor P1 and NMOS transistor N1. The source of transistor P1 is held at potential Vdd, the drain of transistor P1 is coupled to the drain of NMOS transistor N1, the source of transistor N1 is grounded, and the gates of transistors N1 and P1 are coupled together. A CCR graph on the right side of FIG. 1 models the circuit on the left side of FIG. 1. This CCR graph comprises resistors R1 and R2, switches S1 and S2, and capacitor C0, connected as shown between a top rail (at a potential Vdd above ground potential) and a bottom rail (at ground potential).

The values of each resistor of a CCR graph that represents a channel depends on the type of the channel (N or P), the channel dimensions (length and width), and the logic value at the gate of the transistor modeled by the resistor.

The conventional IRSIM program uses the well-known Elmore delay model to calculate the potential at each node of a CCR, and also the delay associated with a change in potential (at a node of a CCR) in response to a change in potential at another node. The Elmore model uses a simple depth-first-search on the CCR graph to find the effective resistance from a node to the high and low power supplies respectively, and then uses a voltage divider equation to estimate the voltage value at the node. The delay is obtained by multiplying the effective resistance with the effective capacitance. These conventional steps are described below in greater detail. In general, determining the effective resistances using a simple depth-first-search works if and only if the CCR graph contains no loops (i.e., if there is no resistor loop in the RC circuit). If a resistor loop exists, IRSIM heuristically breaks the loop (thus converting the CCR graph into a graph having a tree structure) before applying the Elmore delay model. CCR graphs indicative of memory circuits typically contain resistor loops, and the inaccuracy introduced by heuristically breaking each such loop is unacceptable and causes application of IRSIM to memory circuits to fail.

BRIEF DESCRIPTION OF PREFERRED EMBODIMENTS

In a class of embodiments, the invention is a method for device level simulation of a circuit modeled by a set of CCR graphs, wherein the circuit includes MOS transistors having unknown gate potentials, each of the CCR graphs includes a top rail, and a bottom rail, and variable nodes (i.e., some number, "N," of variable nodes), each of the transistors having unknown gate potential is modeled in the CCR graphs as a selectable resistor and optionally also at least one other element (e.g., a capacitor), and each said selectable resistor has a selected one of a first resistance and a second resistance much larger than the first resistance. The method includes the steps of: (a) determining potentials $Von_1$, $Von_2$, . . . , $Von_N$, at the variable nodes (of one of the CCR graphs) with each selectable resistor of the graph having its first resistance and without determining effective resistances between the variable nodes and the top rail or the bottom rail, where $Von_i$ is the potential at the ith variable node of one of the CCR graphs; (b) determining potentials $Voff_1$, $Voff_2$, . . . , $Voff_N$, at the variable nodes of the graph with each selectable resistor of the graph having its second resistance and without determining effective resistances between the variable nodes and the top rail or the bottom rail, where $Voff_i$ is the potential at the ith variable node of said one of the CCR graphs; and (c) determining, from the potentials $Von_i$ and the potentials $Voff_i$, ternary values indicative of the potentials at the variable nodes of the graph with no assumption as to resistance of any said selectable resistor. Step (c) can include the steps of: assigning a low potential (logic low) value to each of the variable nodes for which both $Von_i<L$ and $Voff_i<L$, where L is a predetermined low threshold potential; assigning a high potential (logic high) value to each of the variable nodes for which both $Von_i>H$ and $Voff_i>H$, where H is a predetermined high threshold potential; and assigning an undetermined potential value to each of the variable nodes for which neither $Von_i>H$ and $Voff_i>H$ nor $Von_i<L$ and $Voff_i<L$. Optionally, the method also includes the step of determining a transition delay at each of at least one of the variable nodes, where each transition delay is a time required for a variable node to undergo a transition in potential from an initial potential value to a stabilized potential value in response to a change in at least one parameter of the CCR graph that includes the variable node.

In some embodiments, the inventive method is a modified version of the conventional IRSIM method which implements an algorithm for determining potentials at variable nodes of a circuit (modeled by a set of CCR graphs) that is very different than the conventional algorithm employed for this purpose, and implements a delay calculation algorithm that is very different than the delay calculation algorithm employed in the conventional IRSIM method. The circuit can be a memory circuit including a large number of MOS transistors whose gate potentials are unknown, and each CCR graph can include resistor loops. These embodiments of the invention can accurately simulate circuits that the conventional IRSIM method cannot simulate accurately, and typically can simulate circuits as rapidly as can be done with the conventional IRSIM method (e.g., in cases in which both the inventive method and the conventional IRSIM method can generate accurate simulation results), and do not require breaking of resistor loops in any CCR graph representing a MOS transistor circuit.

Other aspects of the invention are a computer system programmed to perform any embodiment of the inventive method, and a computer readable medium which stores code for implementing any embodiment of the inventive method.

DETAILED DESCRIPTION OF PREFERRED EMBODIMENTS

Figure 1:
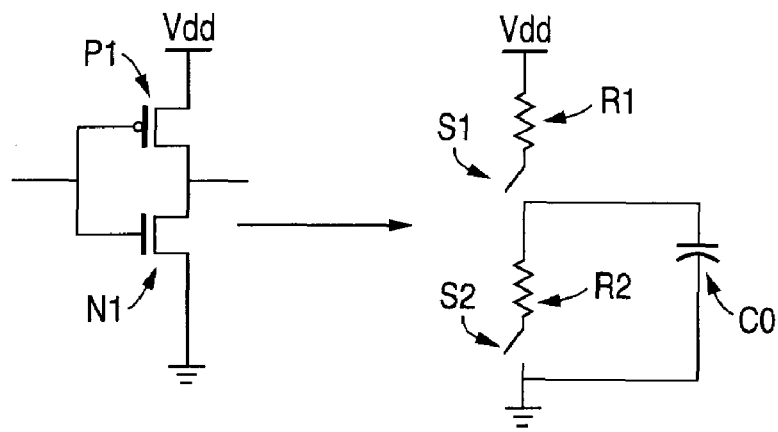
FIG. 1 is schematic diagram of a circuit (on the left side of FIG. 1) and a CCR graph (on the right side of FIG. 1) that models the circuit.

In typical embodiments, the inventive method avoids the above-noted problems that are inherent in the conventional IRSIM program. In accordance with preferred embodiments of the invention, a new heuristic is employed for determining the potentials (logic values) at variable nodes of a CCR graph (e.g., a "final" potential reached by each variable node in response to a change in at least one parameter of the CCR graph) and a new delay calculation algorithm is employed (e.g., to determine the time required for each variable node to stabilize at a changed potential in response to a change in at least one parameter of the CCR graph). These embodiments can achieve accurate results even for memory circuits modeled by CCR graphs that contain resistor loops, without breaking any of the resistor loops.

Using the conventional IRSIM program, calculation of the potential at a node of a CCR graph is difficult when the circuit modeled by the CCR graph contains "X transistors," where "X transistor" denotes a MOS transistor whose gate is at an unknown potential ("X"). When an X transistor is actually on, its channel is conducting, whereas when it is actually off its channel resistance is very large (so that it does not conduct significant current). Both cases need to be modeled before one can predict the logic values at the source and drain of an X transistor.

The conventional IRSIM program uses the following method to calculate the final potential at a node (node "N") in the presence of X transistors, where "Rup" denotes the effective resistance from node N to the top rail (maintained at potential Vdd) and "Rdown" denotes the effective resistance from the bottom rail (maintained at a reference potential, less than Vdd, which will be assumed to be equal to zero from now on) to node N. If Vdd=1, the voltage at node N is given by the simple voltage divider equation:

$$V_N = R\text{down}/(R\text{down}+R\text{up}).$$

In the presence of X transistors, however, each of Rdown and Rup can take several values. Let Rdownmax denote the effective resistance Rdown with each X transistor (in the paths from the node N to the bottom rail) replaced by a very large resistance, Rdownmin denote the effective resistance Rdown with all X transistors (in the paths from the node N to the bottom rail) replaced by their ON channel resistances, Rupmax denote the effective resistance Rup with each X transistor (in the paths from the node N to the top rail) replaced by a very large resistance, and Rupmin denote the effective resistance Rup with all X transistors (in the paths from the node N to the top rail) replaced by their ON channel resistances. The conventional IRSIM program calculates two values Vmin and Vmax:

$$V\text{max} = R\text{downmax}/(R\text{dowmmax}+R\text{upmin}) \text{ and}$$

$$V\text{min} = R\text{downmin}/(R\text{downmin}+R\text{upmax}),$$

and assigns a value to $V_N$ as follows (assuming that Vdd=1):

$V_N = 1$ (if $V\text{min} >$ high threshold), or $\phantom{V_N} = 0$ (if $V\text{max} <$ low threshold), or $\phantom{V_N} = X$ (otherwise).

Typically, high threshold=0.8 and low threshold=0.3. In the presence of resistor loops, Rdownmax, Rdownmin, Rupmax, and Rupmin cannot be calculated easily.

To address this, the following heuristic is employed in accordance with preferred embodiments of the present invention. For each CCR graph containing X transistors, two cases are considered. In one case, all X transistors are replaced by their ON channel resistances and the voltage value ("Von") at each variable node is calculated. In the other case, each X transistor is replaced by a very high resistance (e.g., one teraOhm or one gigaOhm) and the voltage value ("Voff") at each variable node is calculated. The calculations (to be explained below) determine the quantities Von and Voff at each variable node without calculating Rdownmax, Rdownmin, Rupmax, or Rupmin. Although Rdownmax, Rdownmin, Rupmax, and Rupmin are not calculated, the quantities Von and Voff determined in accordance with the invention have the values:

$V\text{on}=R\text{downmin}/(R\text{downmin}+R\text{upmin})$, and $V\text{off}=R\text{downmax}/(R\text{downmax}+R\text{upmax})$, Once "Von" and "Voff" have been determined in accordance with the invention at each variable node, the value $V_N$ is assigned (in accordance with the invention) to the potential at each variable node as follows:

$V_N = 0$ (if $V\text{on} <$ low threshold, and $V\text{off} <$ low threshold), or $\phantom{V_N} = 1$ (if $V\text{on} >$ high threshold, and $V\text{off} >$ high threshold), or $\phantom{V_N} = X$ (otherwise).

The inventive heuristic (which determines the values $V_N$ set forth in the previous paragraph) is expected always to be correct when it predicts a final potential of X at a node (i.e., when it predicts that the final potential is unknown or undeterminable). We next assess cases in which the inventive heuristic predicts a final potential of 1 or 0 at a node but the conventional IRSIM program predicts the potential at the node to be X. We consider cases in which the channel OFF resistance of each transistor (the resistance of the channel when the transistor is off) is on the order of a gigaOhm and is much higher than the channel ON resistance (the resistance of the channel when the transistor is on). Thus, the considered cases assume that the effective resistance of an ON channel in series with an OFF channel is approximately the same as that of a single OFF channel.

We first consider cases in which Von<0.3, Voff<0.3, and 0.3<Vmax<0.8. In these cases the inventive heuristic predicts a final potential of 0, whereas the conventional IRSIM program predicts the potential to be X. The fact that 0.3<Vmax<0.8 implies that the quantity Rupmin is of the same order as Rdownmax. Thus, it is not true that Rdownmax>>Rdownmin, since Rdownmin is of the same order as Rupmin. Thus, a pulldown path from the node to ground always exists. In a CMOS digital circuit, in which the static current is kept at a minimum, the existence of a pulldown path from a node to ground implies that the node is meant to be at ground potential, and that the X transistors on the pullup path are meant to be off. Thus, the final potential predicted by the inventive heuristic is correct, although the conventional IRSIM program predicts that the final potential is undeterminable. A similar explanation applies to cases in which Von>0.8, Voff>0.8, and 0.3<Vmin<0.8, and the final potential predicted by the inventive heuristic is correct in these cases as well.

We next consider cases in which Von<0.3, Voff<0.3, and Vmax>0.8. In these cases the inventive heuristic predicts a final potential of 0 (at a node), whereas the conventional IRSIM program predicts the potential at the node to be X. Since Vmin<0.3 and Vmax>0.8, each path from the node to Vdd and each path from the node to ground contains at least one X transistor. The effective resistances of paths containing X transistors are equal (or approximately equal) when the X transistors are set to their high resistance values. Thus, the fact that Voff<0.3 implies that Rdownmax<(3/7)Rupmax, so that Rupmax>(7/3)Rdownmax. This can mean that the number of paths to Vdd is at least 7/3 times more than the number of paths to ground, but such a situation is rare in a CMOS digital circuit because in most CMOS digital circuits the number of paths from a node to Vdd is comparable to the number of paths from the node to ground. Thus, although the inventive heuristic can predict a wrong potential in these cases, such cases are rare and hence will have small impact. A similar explanation applies to cases in which Von>0.8, Voff>0.8, and Vmin<0.3, so that the final potential predicted by the inventive heuristic is correct in most such cases as well.

We next describe an algorithm employed in a class of embodiments of the invention to predict the potential $V_N$ (i.e., the voltage above the bottom rail) at each variable node of a CCR graph (by determining values Von and Voff at the node) and determining the transition delay at each such node. Assuming that a processor is programmed in accordance with the invention, an input to the processor is a CCR graph having n "variable nodes" and k "reference nodes," where n and k are integers. A "reference node" is a node coupled to a constant voltage source. For example, the ground node (at zero potential) is a reference node. A "variable node" is a node that is not coupled to a constant voltage source.

The CCR graphs can be extracted by the conventional IRSIM program from a transistor netlist, including by replacing transistor channels by constant resistors. It is assumed that the circuit modeled by the CCR graph has the following properties:

all components of the circuit (resistors, capacitors, and voltage sources) are constant. There are no components having variable values (except that each resistor that models an X transistor can be a "selectable resistor" having either a "channel ON" resistance value or a much higher "channel OFF" resistance value);

each capacitor in the circuit is connected between a variable node and ground. A capacitor is connected between each variable node and ground;

there is no capacitor between two variable nodes. Reference nodes (except the ground node) have no capacitors coupled thereto;

the initial values of the potential on each capacitor is known in advance;

a resistor can be connected between any pair of nodes (variable or reference). Two nodes can have more than one resistor between them (e.g., parallel resistors). The expression "adjacent nodes" herein denotes a pair of nodes having one or more transistors between them; and when necessary to prevent the admittance matrix (the admittance matrix is defined below) from becoming singular, there is a very large resistance between each variable node and ground.

Note that resistors representing X transistors have variable value (since the channel resistance of an X transistor can be high or low). This is handled in the voltage calculation by analyzing two versions of the circuit: one in which all resistors representing X transistors are assumed to have their channel ON resistances (the voltage values "Von" are the voltages at the variable nodes in this version of the circuit); the other in which all resistors replacing X transistors are assumed to have their (much higher) channel OFF resistances (the voltage values "Voff" are the voltages at the variable nodes of this version of the circuit).

Given the above restrictions, the set of differential equations governing the behavior of the CCR graph can be written in accordance with the invention in the form:

$$Y'=AY+V_0, \tag{1}$$

where Y is an n×1 vector of potentials at the variable nodes, Y' is the vector of time derivatives of the elements of Y, $V_0$ is an n×1 vector, A is an n×n matrix, and n is the number of variable nodes. In typical implementations of the invention, the equation $Y'=AY+V_0$ is solved twice: once with Y being the vector $(y_1, y_2, \ldots, y_n)$, with $y_i$ being the voltage Von at the ith variable node when the CCR graph includes resistors having their channel ON resistances in place of X transistors, and once with Y being the vector $(y_1, y_2 \ldots, y_n)$, with $y_i$ being the voltage Voff at the ith variable node when the CCR graph includes resistors having their channel OFF resistances in place of X transistors.

The elements of the matrix A (sometimes referred to herein as the "admittance matrix") are given by the following equations:

$$a_{ii} = -\sum_{j \in adjacent(i)} 1/(R_{ij}C_i), \text{ for } i=1, 2, \ldots, n, \tag{2}$$

$$a_{ij}=1/(R_{ij}C_i), \text{ where nodes i and j are adjacent}, \tag{3}$$

and $$a_{ij}=0, \text{ where nodes i and j are not adjacent}. \tag{4}$$

In equation (2), $C_i$ is the capacitance between the ith variable node and ground, and $R_{ij}$ are the resistances between the ith variable node and each jth node, variable or reference, adjacent to the ith variable node. In equation (3), $C_i$ is the capacitance between the ith variable node and the bottom rail, and $R_{ij}$ are the resistances between the ith and jth variable nodes.

The vector $V_0$ (in the equation $Y'=AY+V_0$) is an n×1 vector $(V_{01}, V_{02}, \ldots, V_{0n})$ where:

$$V_{0i} = \sum_k V_{0k}/(R_{ik}C_i),$$

where k∈ reference nodes, $V_{0k}$ is the potential of reference node k that is adjacent to node i, and $R_{ik}$ is the resistance connecting node i and reference node k, and $V_{0i}=0$, if there is no reference node adjacent to node i.

The matrix A is expected to be sparse. Equation system (1) is a non-homogeneous system of linear differential equations. In system (1), the vector $V_0$ and the matrix A are constant (in contrast with some other non-homogeneous systems, in which counterparts to vector $V_0$ and matrix A are not constant).

Figure 2:
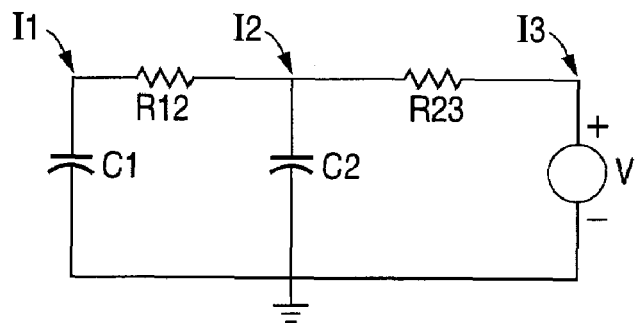
FIG. 2 is schematic diagram of another CCR graph.

As an example, the CCR graph of FIG. 2 can be assessed in accordance with an embodiment of the invention by characterizing the CCR graph as a system of linear differential equations having the form of equation system (1). In FIG. 2, nodes 11 and 12 are variable nodes and node 13 is a reference node. The potential at node 13 is V. FIG. 2 omits large resistances from nodes 11 and 12 to ground since even without such resistances the matrix A for FIG. 2 is not singular. The Kirchoff's current law equations at the variable nodes of FIG. 2 can be written as:

$$C1(dV1/dt)+(V1-V2)/R12=0, \text{ and}$$

$$C2(dV2/dt)+(V2-V1)/R12+(V2-V)/R23=0,$$

where V1 is the potential at node 11 and V2 is the potential at node 12. These equations can be rewritten in the format of equation system (1) with Y'=(dV1/dt, dV2/dt), Y=(V1, V2), $V_0$=(0, V/(R23)(C2)), and matrix A having the elements $a_{11}$=-1/(R12)(C1), $a_{12}$=1/(R12)(C1), $a_{21}$=1/(R12)(C2), and $a_{22}$=-(1/(R12)(C2))-(1/(R23)(C2)).

Methods for determining sets of differential equations that characterize circuits are well known, and some such methods are used by conventional circuit simulators such as the well known SPICE program. However, the differential equations are typically solved by numerical methods, e.g., Euler's method. Numerical methods make the solution process slow and are unsuitable for typical embodiments of the present invention. In preferred embodiments of the inventive method, the necessary differential equations are solved analytically (e.g., in the manner described below). This makes the solution faster, and potentially more accurate.

Non-homogeneous equation system (1) can be converted to a homogeneous system using the transformation $Z=Y+A^{-1}V_0$. Thus, $Z'=Y'$ and $Z_0=Y_0+A^{-1}V_0$, where $Y_0$ is the vector of initial values (t=0) of vector Y, and $A^{-1}$ is the inverse of matrix A. With this transformation, equation system (1) can be rewritten as $$Z'=AZ. \tag{5}$$

Equation (5) is a homogeneous system of linear differential equations with constant coefficients, whose solution is given by:

$$Z=e^{At}Z_0. \tag{6}$$

The quantity $e^A$, where A is the above-defined matrix, can be calculated using the formula:

$$e^A = \sum_{k=0}^{\infty} A^k/k! \tag{7}$$

Here, $A^k$ is A multiplied by itself k times, and $A^0$ is the identity matrix. Let $\lambda=(\lambda_1, \lambda_2, \ldots, \lambda_n)$ be the eigenvalues of A and $Y_1=(y_{11}, y_{21}, \ldots, y_{n1})^T$, $Y_2=(y_{12}, y_{22}, \ldots, y_{n2})^T, \ldots,$ and $Y_n=(y_{1n}, y_{2n}, \ldots, y_{n1})^T$ be the corresponding eigenvectors. We define two n×n matrices P and D based on these quantities: $P=(Y_1 \; Y_2 \ldots Y_n)$, and D is the diagonal matrix whose elements $d_{ij}$ satisfy $d_{ij}=\lambda_i$ for i=j and $d_{ij}=0$ for i≠j.

Since $$AP = (AY_1 \quad AY_2 \quad ... \quad AY_n)$$
$$= (\lambda_1 Y_1 \quad \lambda_2 Y_2 \quad ... \quad \lambda_n Y_n)$$
$$= PD,$$

it follows that $$A = PDP^{-1}. \tag{8}$$

Using equation (8), we write $$A^2 = (PDP^{-1})(PDP^{-1}) = PD^2 P^{-1}, \text{ and}$$

$$A^k = PD^k P^{-1} \text{ for any } k.$$

Therefore, $e^{At} = Pe^{Dt}P^{-1}$ (using equation (7)).

Since Dt is a diagonal matrix, the elements $h_{ij}$ of matrix $H = e^{Dt}$ satisfy $h_{ii} = e^{\lambda_i t}$ for i=j and $h_{ij} = 0$ for i≠j.

Thus from equation (6) we can write $$Z = Pe^{Dt}P^{-1}Z_0. \tag{9}$$

The quantity $P^{-1}Z_0$ is a constant vector, which we denote as $P^{-1}Z_0 = W_0 = (w_1, w_2, \ldots, w_n)$. Thus, equation (9) can be rewritten as:

$$Z = Pe^{Dt}W_0. \tag{10}$$

It follows that each element $z_i$ of vector Z and its time derivative can be expressed as:

$$z_i = \sum_{j=1}^{n} y_{ij} e^{\lambda_j t} w_j \tag{11}$$

and $$\frac{dz_i}{dt} = \sum_{j=1}^{n} \lambda_j y_{ij} e^{\lambda_j t} w_j. \tag{12}$$

Given any timepoint, the elements $z_i$ of the vector Z and the elements $(dz_i/dt)$ of its derivative Z' can be calculated using equations (11) and (12).

In some implementations of the invention, the freely available LAPACK linear algebra program can be employed to compute the eigenvalues and eigenvectors of the circuit matrix.

Given specified initial conditions, the inventive method determines stabilized DC potentials at each variable node of the CCR graph, and can also compute the transition delay for each variable node whose stabilized (final) DC potential is not equal to its initial potential. We define a quantity "simulation time" (sometimes referred to as "T") as the time after which the voltages of the variable nodes are expected to stabilize. Typically, T=10 ns.

In accordance with the invention, the final DC potential at every variable node of a CCR graph is calculated by substituting the simulation time in equation (11), so that t=T in equation (11), then computing the above-defined vector Z, and then computing above-defined vector Y as $Y = Z - A^{-1}V_0$. This is done once with the CCR graph including resistors having their channel ON resistances (in place of the X transistors of the circuit represented by the CCR graph), to compute the vector $Y = (y_1, y_2, \ldots, y_n)$, with each element $y_i$ being the potential Von at the ith variable node. Another computation is done with the CCR graph including resistors having their channel OFF resistances (in place of the X transistors of the circuit represented by the CCR graph), to compute the vector $Y = (y_1, y_2, \ldots, y_n)$, with each element $y_i$ being the potential Voff at the ith variable node. Once the potentials "Von" and "Voff" have been determined in accordance with the invention at each variable node, the value $V_N$ is assigned to the potential at each variable node as described above:

$$V_N =$$
0 (if each of "Von" and "V off" for the node is less than a predetermined "low threshold" value), or
= 1 (if each of "Von" and "V off" for the node is greater than a predetermined "high threshold" value), or
= X (otherwise).

We next describe the steps performed in a class of embodiments of the invention to predict transition delays at each variable node of a CCR graph whose stabilized (final) DC potential is not equal to its initial potential. In the description, the final (stabilized) potential at variable node i (at time t=T) is denoted as $y_{i,final}$ and the initial potential at variable node i (at time t=0) is denoted as $y_{i,initial}$. In this class of embodiments, after computing the final potential value at each variable node i, a threshold potential value $y_{i,threshold}$ for each variable node i, is computed as follows:

$$y_{i,threshold} = y_{i,final} - ((y_{i,final} - y_{i,initial})/e). \tag{13}$$

For each variable node i having a determinable potential, the value $z_{i,threshold}$ is also computed using the relation $Z = Y + A^{-1}V_0$. The transition delay of variable node i is defined as the time ($t_{thresh}$) at which the node reaches $y_{i,threshold}$. The time $t_{thresh}$ for every node i can be found by solving the following equation for t:

$$z_i(t) - z_{i,thresh} = 0. \tag{14}$$

Equation (14) can be solved by the well known Newton-Raphson method, since the time derivative of $z_i$ is defined at every timepoint (by equation 12). Also, the waveform at $z_i$ is expected to be smooth, and thus the Newton-Raphson method will typically converge to a solution in just a few iterations. However, in some cases, calculation of the desired quantities by the Newton-Raphson method may fail. For example, if at t=0, $dz_i/dt$ is positive for some node i, then the next time point obtained by the Newton-Raphson method is negative. This causes a problem since equations (11) and (12) are not defined for t<0. In this and other cases in which the Newton-Raphson method fails (or otherwise in lieu of performing the Newton-Raphson method), a bisection method can be employed in accordance with the invention to calculate the transition delay ($t_{thresh}$) for each variable node i. To perform the bisection method, a region in which the solution lies is initially detected. This can be done by stepping through the waveform using a large time-step and checking for the values of the function at endpoints of the time interval. Once the relevant time interval is found, a bisection method (which can be of a well known type) is applied to estimate the exact solution.

Other aspects of the invention are a computer system programmed to perform any embodiment of the inventive method, and a computer readable medium which stores code for implementing any embodiment of the inventive method.

Figure 3:
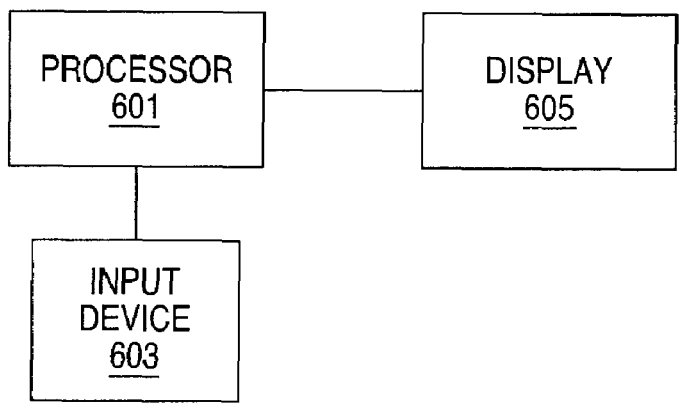
FIG. 3 is block diagram of a computer system including a processor programmed to perform at least one embodiment of the inventive method.

A computer system (e.g., the system of FIG. 3) can be programmed to implement the inventive method. The computer system of FIG. 3 includes processor 601, input device 603 coupled to processor 601, and display device 605 coupled to processor 601. Processor 601 is programmed to implement at least one embodiment of the inventive method in response to instructions and data entered by user manipulation of input device 603. When processor determines ternary values indicative of the potentials at variable nodes of a CCR graph (with no assumption as to resistance of any selectable resistor of the CCR graph) in accordance with the invention, display device 605 typically displays data indicative of a result of this determination.

Figure 4:
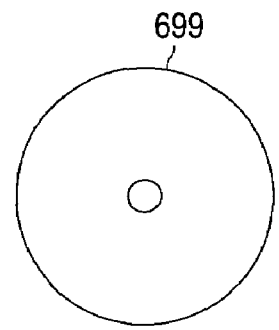
FIG. 4 is an elevational view of a computer readable optical disk on which is stored computer code for implementing at least one embodiment of the inventive method.

Computer readable optical disk 699 of FIG. 4 has computer code stored thereon. This code is suitable for programming processor 601 to implement at least one embodiment of the inventive method.

The inventors have programmed a computer system to perform an embodiment of the inventive method in the class of embodiments described with reference to equations (1) through (14). The programmed system performed the inventive method to assess several CCR graphs accurately. The conventional IRSIM program executed by the same computer system (when the system had been programmed to run the IRSIM program) did not assess the same graphs accurately. One such set of CCR graphs modeled a 3.3.V dual port RAM circuit designed using a 0.35 micron technology. Another such set of CCR graphs modeled a 1.08V ROM circuit designed using a 0.13 micron technology.

It should be understood that various alternatives to the embodiments of the invention described herein may be employed in practicing the invention. It is intended that the following claims define the scope of the invention and that systems and methods within the scope of these claims and their equivalents be covered thereby.

What is claimed is:

1. A method for device level simulation of a circuit modeled by a set of CCR (channel connected region) graphs wherein the circuit includes MOS transistors having unknown gate potentials, each of the CCR graphs includes a top rail, and a bottom rail, and N variable nodes, each of the transistors having unknown gate potential is modeled in the CCR graphs as a selectable resistor and optionally also at least one other element, and each said selectable resistor has a selected one of a first resistance and a second resistance much larger than the first resistance, said method including the steps of:

(a) determining potentials $Von_1$, $Von_2$, ..., $Von_N$, at the variable nodes of one of the CCR graphs with each said selectable resistor of said one of the CCR graphs having its first resistance, and without determining effective resistances between the variable nodes of said one of the CCR graphs and the top rail or the bottom rail, where $Von_i$ is the potential at the ith variable node of said one of the CCR graphs;

(b) determining potentials $Voff_1$, $Voff_2$, ..., $Voff_N$, at the variable nodes of said one of the CCR graphs with each said selectable resistor of said one of the CCR graphs having its second resistance, and without determining effective resistances between the variable nodes of said one of the CCR graphs and the top rail or the bottom rail where $Voff_i$ is the potential at the ith variable node of said one of the CCR graphs; and (c) determining from the potentials $Von_i$ and the potentials $Voff_i$,
ternary values indicative of the potentials at the variable nodes of said one of the CCR graphs with no assumption as to resistance of any said selectable resistor, wherein step (a) includes the step of:

identifying elements $y_i$ of an N×1 vector $Y=Z-A^{-1}V_0$, as the potentials $Von_i$, wherein $1 \leq i \leq N$, $$z_i = \sum_{j=1}^{N} y_{ij} e^{\lambda_j T} w_j,$$

Z is an N×1 vector whose elements are
A is an N×N matrix whose elements are:

$$a_{ii} = - \sum_{j \in adjacent(i)} 1/(R_{ij}C_i),$$

for i=1, 2, ..., N, where $R_{ij}$ are resistances between the ith variable node and each jth node, whether a variable node or a reference node, that is adjacent to the ith variable node, assuming that each said selectable resistor has its first resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{01}, V_{02}, ..., V_{0N})$ where:

$$V_{0i} = \sum_k V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}=0$, if there is no reference node adjacent to the ith variable node, T is a simulation time, $\lambda_1, \lambda_2, ..., $ and $\lambda_N$ are eigenvalues of the matrix A, and $Y_1=(y_{11}, y_{21}, ..., y_{N1})^T$, $Y_2=(y_{12}, y_{22}, ..., y_{N2})^T$, ..., and $Y_N=(y_{1N}, y_{2N}, ..., y_{NN})^T$ are eigenvectors corresponding to the eigenvalues $\lambda_1, \lambda_2, ...,$ and $\lambda_N$, and $W_0=(w_1, w_2, ..., w_N)=P^{-1}Z_0$, where P is the matrix $P=(Y_1 Y_2 ... Y_N)$, $Z_0=Y_0+A^{-1}V_0$, and $Y_0$ is an N×1 vector of initial values of the potentials at the variable nodes.

2. A method for device level simulation of a circuit modeled by a set of CCR (channel connected region) graphs, wherein the circuit includes MOS transistors having unknown gate potentials, each of the CCR graphs includes a top rail, and a bottom rail, and N variable nodes, each of the transistors having unknown gate potential is modeled in the CCR graphs as a selectable resistor and optionally also at least one other element, and each said selectable resistor has a selected one of a first resistance and a second resistance much larger than the first resistance, said method including the steps of:

(a) determining potentials $Von_1$, $Von_2$, ..., $Von_N$, at the variable nodes of one of the CCR graphs with each said selectable resistor of said one of the CCR graphs having its first resistance, and without determining effective resistances between the variable nodes of said one of the CCR graphs and the top rail or the bottom rail, where $Von_i$ is the potential at the ith variable node of said one of the CCR graphs;

(b) determining potentials $Voff_1, Voff_2, \ldots, Voff_N$, at the variable nodes of said one of the CCR graphs with each said selectable resistor of said one of the CCR graphs having its second resistance, and without determining effective resistances between the variable nodes of said one of the CCR graphs and the top rail or the bottom rail, where $Voff_i$ is the potential at the ith variable node of said one of the CCR graphs; and (c) determining, from the potentials $Von_i$ and the potentials $Voff_i$, ternary values indicative of the potentials at the variable nodes of said one of the CCR graphs with no assumption as to resistance of any said selectable resistor, wherein step (b) includes the step of:

identifying elements $y_i$ of an N×1 vector $Y=Z-A^{-1}V_0$, as the potentials $Voff_i$, wherein $1 \leq i \leq N$, Z is an N×1 vector whose elements are $$z_i = \sum_{j=1}^{N} y_{ij} e^{\lambda_j T} w_j,$$

A is an N×N matrix whose elements are:

$$a_{ii} = - \sum_{j \in adjacent(i)} 1/(R_{ij} C_i), \text{ for } i = 1, 2, \ldots, N,$$

where $R_{ij}$ are resistances between the ith variable node and each jth node, whether a variable node or a reference node, that is adjacent to the ith variable node, assuming that each said selectable resistor has its second resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{01}, V_{02}, \ldots, V_{0N})$ where:

$$V_{0i} = \sum_k V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}=0$, if there is no reference node adjacent to the ith variable node, T is a simulation time, $\lambda_1, \lambda_2, \ldots,$ and $\lambda_N$ are eigenvalues of the matrix A, and $Y_1=(y_{11}, y_{21}, \ldots, y_{N1})^T$, $Y_2=(y_{12}, y_{22}, \ldots, y_{N2})^T, \ldots,$ and $Y_N=(y_{1N}, y_{2N}, \ldots, y_{NN})^T$ are eigenvectors corresponding to the eigenvalues $\lambda_1, \lambda_2, \ldots,$ and $\lambda_N$, and $W_0=(w_1, w_2, \ldots, w_N)=P^{-1}Z_0$, where P is the matrix $P=(Y_1 Y_2 \ldots Y_N)$, $Z_0=Y_0+A_{-1}V_0$, and $Y_0$ is an N×1 vector of initial values of the potentials at the variable nodes.

3. The method of claim 1, also including the step of determining a transition delay at each of at least one of the variable nodes, wherein each said transition delay is a time required for one of the variable nodes to undergo a transition in potential from an initial potential value to a stabilized potential value in response to a change in at least one parameter of the CCR graph that includes said one of the variable nodes.

4. A system programmed to perform device level simulation of a circuit modeled by a set of CCR (channel connected region) graphs, wherein the circuit includes MOS transistors having unknown gate potentials, each of the CCR graphs has a top rail, a bottom rail, and N variable nodes, each of the transistors having unknown gate potential is modeled in the CCR graphs as a selectable resistor and optionally also at least one other element, and each said selectable resistor has a selected one of a first resistance and a second resistance much larger than the first resistance, said system including:

a processor programmed to determine potentials $Von_1, Von_2, \ldots, Von_N$, at the variable nodes of one of the CCR graphs with each said selectable resistor of said one of the CCR graphs having its first resistance, and without determining effective resistances between the variable nodes of said one of the CCR graphs and the top rail or the bottom rail, where $Von_i$ is the potential at the ith variable node of said one of the CCR graphs, to determine potentials $Voff_1, Voff_2, \ldots, Voff_N$, at the variable nodes of said one of the CCR graphs with each said selectable resistor having its second resistance, and without determining effective resistances between the variable nodes of said one of the CCR graphs and the top rail or the bottom rail, where $Voff_i$ is the potential at the ith variable node of said one of the CCR graphs, and to determine, from the potentials $Von_i$ and the potentials $Voff_i$, ternary values indicative of the potentials at the variable nodes of said one of the CCR graphs with no assumption as to resistance of any said selectable resistor; and a display device coupled to the processor for displaying a result of said determination of the ternary potentials, wherein the processor is programmed to identify elements $y_i$ of an N×1 vector $Y=Z-A^{-1}V_0$, as the potentials $Von_i$, wherein $1 \leq i \leq N$, Z is an N×1 vector whose elements are $$z_i = \sum_{j=1}^{N} y_{ij} e^{\lambda_j T} w_j,$$

A is an N×N matrix whose elements are:

$$a_{ii} = - \sum_{j \in adjacent(i)} 1/(R_{ij} C_i),$$

for $i=1, 2, \ldots, N$, where $R_{ij}$ are resistances between the ith variable node and each jth node, whether a variable node or a reference node, that is adjacent to the ith variable node, assuming that each said selectable resistor has its first resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{O1}, V_{O2}, \ldots, V_{ON})$ where:

$$V_{0i} = \sum_k V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}=0$, if there is no reference node adjacent to the ith variable node, T is a simulation time, $\lambda_1, \lambda_2, \ldots,$ and $\lambda_N$ are eigenvalues of the matrix A, and $Y_1=(y_{11}, y_{21}, \ldots, y_{N1})^T, Y_2=(y_{12}, y_{22}, \ldots, y_{N2})^T, \ldots,$ and $Y_N=(y_{1N}, y_{2N}, \ldots, y_{NN})^T$ are eigenvectors corresponding to the eigenvalues $\lambda_1, \lambda_2, \ldots,$ and $\lambda_N$, and $W_0=(w_1, w_2, \ldots, w_N)=P^{-1}Z_0$, where P is the matrix $P=(Y_1 Y_2 \ldots Y_N), Z_0=Y_0+A^{-1}V_0$, and $Y_0$ is an N×1 vector of initial values of the potentials at the variable nodes.

5. A system programmed to perform device level simulation of a circuit modeled by a set of CCR (channel connected region) graphs, wherein the circuit includes MOS transistors having unknown gate potentials, each of the CCR graphs has a top rail, a bottom rail, and N variable nodes, each of the transistors having unknown gate potential is modeled in the CCR graphs as a selectable resistor and optionally also at least one other element, and each said selectable resistor has a selected one of a first resistance and a second resistance much larger than the first resistance, said system including:

a processor programmed to determine potentials $Von_1, Von_2, \ldots, Von_N$, at the variable nodes of one of the CCR graphs with each said selectable resistor of said one of the CCR graphs having its first resistance, and without determining effective resistances between the variable nodes of said one of the CCR graphs and the top rail or the bottom rail, where $Von_i$ is the potential at the ith variable node of said one of the CCR graphs, to determine potentials $Voff_1, Voff_2, \ldots, Voff_N$, at the variable nodes of said one of the CCR graphs with each said selectable resistor having its second resistance, and without determining effective resistances between the variable nodes of said one of the CCR graphs and the top rail or the bottom rail, where $Voff_i$ is the potential at the ith variable node of said one of the CCR graphs, and to determine, from the potentials $Von_i$ and the potentials $Voff_i$, ternary values indicative of the potentials at the variable nodes of said one of the CCR graphs with no assumption as to resistance of any said selectable resistor; and a display device coupled to the processor for displaying a result of said determination of the ternary potentials, wherein the processor is programmed to identify elements $y_i$ of an N×1 vector $Y=Z-A^{-1}V_0$, as the potentials $Voff_i$, wherein $1 \leq i \leq N$, Z is an N×1 vector whose elements are $$z_i = \sum_{j=1}^N y_{ij}e^{\lambda_j T}w_j,$$

A is an N×N matrix whose elements are:

$$a_{ii} = -\sum_{j \in adjacent(i)} 1/(R_{ij}C_i),$$

for $i=1, 2, \ldots, N$, where $R_{ij}$ are resistances between the ith variable node and each jth node, whether a variable node or a reference node, that is adjacent to the ith variable node, assuming that each said selectable resistor has its second resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{O1}, V_{O2}, \ldots, V_{ON})$ where:

$$V_{0i} = \sum_k V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}=0$, if there is no reference node adjacent to the ith variable node, T is a simulation time, $\lambda_1, \lambda_2, \ldots,$ and $\lambda_N$ are eigenvalues of the matrix A, and $Y_1=(y_{11}, y_{21}, \ldots, y_{N1})^T, Y_2=(y_{12}, y_{22}, \ldots, y_{N2})^T, \ldots,$ and $Y_N=(y_{1N}, y_{2N}, \ldots, y_{NN})^T$ are eigenvectors corresponding to the eigenvalues $\lambda_1, \lambda_2, \ldots,$ and $\lambda_N$, and $W_0=(w_1, w_2, \ldots, w_N)=P^{-1}Z_0$, where P is the matrix $P=(Y_1 Y_2 \ldots Y_N), Z_0=Y_0+A^{-1}V_0$, and $Y_0$ is an N×1 vector of initial values of the potentials at the variable nodes.

6. A computer-readable medium which stores code for programming a processor to perform device level simulation of a circuit modeled by a set of CCR (channel connected region) graphs, wherein the circuit includes MOS transistors having unknown gate potentials, each of the CCR graphs has a top rail, a bottom rail, and N variable nodes, each of the transistors having unknown gate potential is modeled in the CCR graphs as a selectable resistor and optionally also at least one other element and each said selectable resistor has a selected one of a first resistance and a second resistance much larger than the first resistance, including by determining potentials $Von_1, Von_2, \ldots, Von_N$, at the variable nodes of one of the CCR graphs with each said selectable resistor of said one of the CCR graphs having its first resistance and without determining effective resistances between the variable nodes of said one of the CCR graphs and the top rail or the bottom rail where $Von_i$ is the potential at the ith variable node of said one of the CCR graphs, determining potentials $Voff_1$, $Voff_2$, ..., $Voff_N$, at the variable nodes of said one of the CCR graphs with each said selectable resistor of said one of the CCR graphs having its second resistance, and without determining effective resistances between the variable nodes of said one of the CCR graphs and the top rail or the bottom rail, where $Voff_i$ is the potential at the ith variable node of said one of the CCR graphs, and determining, from the potentials $Von_i$ and the potentials $Voff_i$, ternary values indicative of the potentials at the variable nodes of said one of the CCR graphs with no assumption as to resistance of any said selectable resistor, wherein the code is for programming the processor to identify elements $y_i$ of an N×1 vector $Y=Z-A^{-1}V_0$, as the potentials $Von_i$, wherein $1 \leq i \leq N$, Z is an N×1 vector whose elements are $$z_i = \sum_{j=1}^{N} y_{ij} e^{\lambda_j T} w_j,$$

A is an N×N matrix whose elements are:

$$a_{ii} = -\sum_{j \in adjacent(i)} 1/(R_{ij}C_i),$$

for i=1, 2, ..., N, where $R_{ij}$ are resistances between the ith variable node and each jth node, whether a variable node or a reference node, that is adjacent to the ith variable node, assuming that each said selectable resistor has its first resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{01}, V_{02}, ..., V_{0N})$ where:

$$V_{0i} = \sum_{k} V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}=0$, if there is no reference node adjacent to the ith variable node, T is a simulation time, $\lambda_1, \lambda_2, ..., $ and $\lambda_N$ are eigenvalues of the matrix A, and $Y_1=(y_{11}, y_{21}, ..., y_{N1})^T$, $Y_2=(y_{12}, y_{22}, ..., y_{N2})^T$, ..., and $Y_N=(y_{1N}, y_{2N}, ..., y_{NN})^T$ are eigenvectors corresponding to the eigenvalues $\lambda_1, \lambda_2, ..., $ and $\lambda_N$, and $W_0=(w_1, w_2, ..., w_N)=P^{-1}Z_0$, where P is the matrix $P=(Y_1 Y_2 ... Y_N)$, $Z_0=Y_0+A^{-1}V_0$, and $Y_0$ is an N×1 vector of initial values of the potentials at the variable nodes.

7. A computer-readable medium which stores code for programming a processor to perform device level simulation of a circuit modeled by a set of CCR (channel connected region) graphs, wherein the circuit includes MOS transistors having unknown gate potentials each of the CCR graphs has a top rail a bottom rail and N variable nodes, each of the transistors having unknown gate potential is modeled in the CCR graphs as a selectable resistor and optionally also at least one other element, and each said selectable resistor has a selected one of a first resistance and a second resistance much larger than the first resistance, including by determining potentials $Von_1$, $Von_2$, ..., $Von_N$, at the variable nodes of one of the CCR graphs with each said selectable resistor of said one of the CCR graphs having its first resistance, and without determining effective resistances between the variable nodes of said one of the CCR graphs and the top rail or the bottom rail where $Von_i$ is the potential at the ith variable node of said one of the CCR graphs, determining potentials $Voff_1$, $Voff_2$, ..., $Voff_N$, at the variable nodes of said one of the CCR graphs with each said selectable resistor of said one of the CCR graphs having its second resistance, and without determining effective resistances between the variable nodes of said one of the CCR graphs and the top rail or the bottom rail, where $Voff_i$ is the potential at the ith variable node of said one of the CCR graphs, and determining from the potentials $Von_i$ and the potentials $Voff_i$, ternary values indicative of the potentials at the variable nodes of said one of the CCR graphs with no assumption as to resistance of any said selectable resistor, wherein the code is for programming the processor to identify elements $y_i$ of an N×1 vector $Y=Z-A^{-1}V_0$, as the potentials $Voff_i$, wherein $1 \leq i \leq N$, Z is an N×1 vector whose elements are $$z_i = \sum_{j=1}^{N} y_{ij} e^{\lambda_j T} w_j,$$

A is an N×N matrix whose elements are:

$$a_{ii} = -\sum_{j \in adjacent(i)} 1/(R_{ij}C_i),$$

for i=1, 2, ..., N, where $R_{ij}$ are resistances between the ith variable node and each jth node, whether a variable node or a reference node, that is adjacent to the ith variable node, assuming that each said selectable resistor has its second resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{01}, V_{02}, \ldots, V_{0N})$ where:

$$V_{0i} = \sum_{k} V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}$=0, if there is no reference node adjacent to the ith variable node, T is a simulation time, $\lambda_1, \lambda_2, \ldots,$ and $\lambda_N$ are eigenvalues of the matrix A, and $Y_1=(y_{11}, y_{21}, \ldots, y_{N1})^T$, $Y_2=(y_{12}, y_{22}, \ldots, y_{N2})^T, \ldots,$ and $Y_N=(y_{1N}, y_{2N}, \ldots, y_{NN})^T$ are eigenvectors corresponding to the eigenvalues $\lambda_1, \lambda_2, \ldots,$ and $\lambda_N$, and $W_0=(w_1, w_2, \ldots, w_N)=P^{-1}Z_0$, where P is the matrix $P=(Y_1\ Y_2\ldots Y_N)$, $Z_0=Y_0+A^{-1}V_0$, and $Y_0$ is an N×1 vector of initial values of the potentials at the variable nodes.

8. A method for device level simulation of a circuit including MOS transistors having unknown gate potentials, said method including the steps of:

(a) determining a CCR (channel connected region) graphs that models the circuit, wherein the CCR graph includes N variable nodes, a top rail, and a bottom rail, and the CCR graph models each of the transistors having unknown gate potential by a selectable resistor and optionally also at least one other element, each said selectable resistor having a selected one of a first resistance and a second resistance much larger than the first resistance;

(b) determining potentials $Von_1, Von_2, \ldots, Von_N$, at the variable nodes with each said selectable resistor having its first resistance and without determining effective resistances between the variable nodes and the top rail or the bottom rail, where $Von_i$ is the potential at the ith variable node of the CCR graph;

(c) determining potentials $Voff_1, Voff_2, \ldots, Voff_N$ at the variable nodes with each said selectable resistor having its second resistance and without determining effective resistances between the variable nodes and the top rail or the bottom rail where $Voff_i$ is the potential at the ith variable node of the CCR graph; and (d) determining, from the potentials $Von_i$ and the potentials $Voff_i$, ternary values indicative of the potentials at the variable nodes with no assumption as to resistance of any said selectable resistor, wherein step (b) includes the step of:

identifying elements $y_i$ of an N×1 vector $Y=Z-A^{-1}V_0$, as the potentials $Von_i$, wherein $1 \leq i \leq N$, Z is an N×1 vector whose elements are $$z_i = \sum_{j=1}^{N} y_{ij} e^{\lambda_j T} w_j,$$

A is an N×N matrix whose elements are:

$$a_{ii} = - \sum_{j \in adjacent(i)} 1/(R_{ij}C_i),$$

for i=1, 2, ..., N, where $R_{ij}$ are resistances between the ith variable node and each jth node, whether a variable node or a reference node, that is adjacent to the ith variable node, assuming that each said selectable resistor has its first resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{01}, V_{02}, \ldots, V_{0N})$ where:

$$V_{0i} = \sum_{k} V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}$=0, if there is no reference node adjacent to the ith variable node, T is a simulation time, $\lambda_1, \lambda_2, \ldots,$ and $\lambda_N$ are eigenvalues of the matrix A, and $Y_1=(y_{11}, y_{21}, \ldots, y_{N1})^T$, $Y_2=(y_{12}, y_{22}, \ldots, y_{N2})^T, \ldots,$ and $Y_N=(y_{1N}, y_{2N}, \ldots, y_{NN})^T$ are eigenvectors corresponding to the eigenvalues $\lambda_1, \lambda_2, \ldots,$ and $\lambda_N$, and $W_0=(w_1, w_2, \ldots, w_N)=P^{-1}Z_0$, where P is the matrix $P=(Y_1\ Y_2\ldots Y_N)$, $Z_0=Y_0+A^{-1}V_0$, and $Y_0$ is an N×1 vector of initial values of the potentials at the variable nodes.

9. A method for device level simulation of a circuit including MOS transistors having unknown gate potentials said method including the steps of:

(a) determining a CCR (channel connected region) graphs that models the circuit wherein the CCR graph includes N variable nodes, a top rail, and a bottom rail, and the CCR graph models each of the transistors having unknown gate potential by a selectable resistor and optionally also at least one other element, each said selectable resistor having a selected one of a first resistance and a second resistance much larger than the first resistance;

(b) determining potentials $Von_1, Von_2, \ldots, Von_N$, at the variable nodes with each said selectable resistor having its first resistance and without determining effective resistances between the variable nodes and the top rail or the bottom rail where $Von_i$ is the potential at the ith variable node of the CCR graph;

(c) determining potentials $Voff_1, Voff_2, \ldots, Voff_N$, at the variable nodes with each said selectable resistor having its second resistance and without determining effective resistances between the variable nodes and the top rail or the bottom rail where $Voff_i$ is the potential at the ith variable node of the CCR graph; and (d) determining, from the potentials $Von_i$ and the potentials $Voff_i$, ternary values indicative of the potentials at the variable nodes with no assumption as to resistance of any said selectable resistor, wherein step (c) includes the step of:

identifying elements $y_i$ of an N×1 vector $Y=Z-A^{-1}V_0$, as the potentials $Voff_i$, wherein $1 \leq i \leq N$, Z is an N×1 vector whose elements are $$z_i = \sum_{j=1}^{N} y_{ij} e^{\lambda_j T} w_j,$$

A is an N×N matrix whose elements are:

$$a_{ii} = -\sum_{j \in adjacent(i)} 1/(R_{ij}C_i),$$

for i=1, 2, ..., N, where $R_{ij}$ are resistances between the ith variable node and each jth node, whether a variable node or a reference node, that is adjacent to the ith variable node, assuming that each said selectable resistor has its second resistance, and $C_i$ is the capacitance between the ith variable node and the bottom rail, $a_{ij}=1/(R_{ij}C_i)$, for the ith and jth variable nodes, where said variable nodes are adjacent, where $C_i$ is the capacitance between the ith variable node and the bottom rail, and $R_{ij}$ are resistances between the ith and jth variable nodes, and $a_{ij}=0$, for the ith and jth variable nodes, where said variable nodes are not adjacent, $V_0$ is an N×1 vector $(V_{01}, V_{02}, \ldots, V_{0N})$ where:

$$V_{0i} = \sum_k V_{0k}/(R_{ik}C_i),$$

where the summation is over all reference nodes of the CCR graph, $V_{0k}$ is the potential of the kth one of the reference nodes that is adjacent to the ith variable node, and $R_{ik}$ is the resistance between the ith variable node and the kth one of the reference nodes that is adjacent to the ith variable node, and $V_{0i}=0$, if there is no reference node adjacent to the ith variable node, T is a simulation time, $\lambda_1, \lambda_2, \ldots,$ and $\lambda_N$ are eigenvalues of the matrix A, and $Y_1=(y_{11}, y_{21}, \ldots, y_{N1})^T$, $Y_2=(y_{12}, y_{22}, \ldots, y_{N2})^T, \ldots,$ and $Y_N=(y_{1N}, y_{2N}, \ldots, y_{NN})^T$ are eigenvectors corresponding to the eigenvalues $\lambda_1, \lambda_2, \ldots,$ and $\lambda_N$, and $W_0=(w_1, w_2, \ldots, w_N)=P^{-1}Z_0$, where P is the matrix $P=(Y_1\ Y_2 \ldots Y_N)$, $Z_0=Y_0+A^{-1}V_0$, and $Y_0$ is an N×1 vector of initial values of the potentials at the variable nodes.

* * * * *

UNITED STATES PATENT AND TRADEMARK OFFICE
CERTIFICATE OF CORRECTION

PATENT NO. : 7,333,924 B1 Page 1 of 1
APPLICATION NO. : 10/880181
DATED : February 19, 2008
INVENTOR(S) : T. R. Dastidar et al.

It is certified that error appears in the above-identified patent and that said Letters Patent is hereby corrected as shown below:

In Column 12, lines 6-11, " $z_i = \sum_{j=1}^{N} y_{ij} e^{\lambda_j T} w_j$ , Z is an N × 1 vector whose elements are" should be -- Z is an N × 1 vector whose elements are $z_i = \sum_{j=1}^{N} y_{ij} e^{\lambda_j T} w_j$ , --.

Signed and Sealed this

Sixteenth Day of September, 2008

JON W. DUDAS
*Director of the United States Patent and Trademark Office*